(12) United States Patent
Yu et al.

(10) Patent No.: US 11,664,235 B2
(45) Date of Patent: May 30, 2023

(54) PHOTORESIST REMOVAL

(71) Applicant: TAIWAN SEMICONDUCTOR MANUFACTURING COMPANY LIMITED, Hsin-Chu (TW)

(72) Inventors: Shang-Yuan Yu, Hsinchu (TW); Hsiao Chien-Wen, Hsinchu (TW); Jui-Chuan Chang, Zhubei (TW); Shao-Fu Hsu, Hsinchu (TW); Shao-Yen Ku, Jhubei (TW); Wen-Chang Tsai, Hsinchu (TW); Yuan-Chih Chiang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 1045 days.

(21) Appl. No.: 15/797,057

(22) Filed: Oct. 30, 2017

(65) Prior Publication Data
US 2018/0047580 A1 Feb. 15, 2018

Related U.S. Application Data

(62) Division of application No. 14/014,455, filed on Aug. 30, 2013, now Pat. No. 9,805,946.

(51) Int. Cl.
*H01L 21/311* (2006.01)
*H01L 21/67* (2006.01)
*G03F 7/42* (2006.01)

(52) U.S. Cl.
CPC .......... *H01L 21/31133* (2013.01); *G03F 7/42* (2013.01); *G03F 7/423* (2013.01); *H01L 21/6708* (2013.01)

(58) Field of Classification Search
None
See application file for complete search history.

(56) References Cited

U.S. PATENT DOCUMENTS

| 6,848,455 | B1 * | 2/2005 | Shrinivasan | .............. | B08B 3/08 134/1.3 |
| 7,329,616 | B2 * | 2/2008 | Orii | .................... | H01L 21/67051 438/778 |
| 8,251,077 | B2 * | 8/2012 | Aratake | ............ | H01L 21/67051 134/148 |

(Continued)

*Primary Examiner* — Sylvia MacArthur
(74) *Attorney, Agent, or Firm* — Cooper Legal Group, LLC (57) ABSTRACT

Among other things, one or more systems and techniques for removing a photoresist from a semiconductor wafer are provided. The photoresist is formed over the semiconductor wafer for patterning or material deposition. Once completed, the photoresist is removed in a manner that mitigates damage to the semiconductor wafer or structures formed thereon. In an embodiment, trioxygen liquid is supplied to the photoresist. The trioxygen liquid is activated using an activator, such as an ultraviolet activator or a hydrogen peroxide activator, to create activated trioxygen liquid used to remove the photoresist. In an embodiment, the activation of the trioxygen liquid results in free radicals that aid in removing the photoresist. In an embodiment, an initial photoresist strip, such as using a sulfuric acid hydrogen peroxide mixture, is performed to remove a first portion of the photoresist, and the activated trioxygen liquid is used to remove a second portion of the photoresist.

20 Claims, 11 Drawing Sheets

(56) References Cited

U.S. PATENT DOCUMENTS

| | | | |
|---|---|---|---|
| 2004/0253833 A1* | 12/2004 | Takehiko | H01L 21/6708 438/778 |
| 2004/0261817 A1* | 12/2004 | Araki | H01L 21/67051 134/102.1 |
| 2005/0026435 A1* | 2/2005 | Chen | G03F 7/423 438/689 |
| 2005/0061659 A1* | 3/2005 | Kurashina | H01L 21/02074 204/198 |
| 2005/0158674 A1* | 7/2005 | Bertucci | G03C 7/39292 430/502 |
| 2005/0241673 A1* | 11/2005 | Endo | G03F 7/423 134/1.3 |
| 2007/0154636 A1* | 7/2007 | Hashizume | B05B 7/066 118/313 |
| 2008/0017222 A1* | 1/2008 | Miya | H01L 21/67051 134/116 |
| 2008/0110861 A1* | 5/2008 | Kajita | B08B 11/02 216/83 |
| 2008/0142054 A1* | 6/2008 | Eitoku | H01L 21/6708 134/30 |
| 2010/0071718 A1* | 3/2010 | Le | G03F 7/427 134/1 |
| 2010/0200547 A1* | 8/2010 | Higashijima | H01L 21/6708 216/92 |
| 2011/0226626 A1* | 9/2011 | Choi | C25D 17/001 156/345.21 |
| 2012/0186744 A1* | 7/2012 | Higashijima | H01L 21/68792 156/345.21 |
| 2013/0014784 A1* | 1/2013 | Ito | H01L 21/67051 134/30 |
| 2013/0180659 A1* | 7/2013 | Itoh | H01L 21/465 156/345.21 |
| 2013/0340796 A1* | 12/2013 | Kawano | H01L 21/02057 134/28 |
| 2014/0216500 A1* | 8/2014 | Hsiao | H01L 21/02071 134/10 |
| 2015/0093905 A1* | 4/2015 | Fujiwara | H01L 21/67028 438/745 |

* cited by examiner

PHOTORESIST REMOVAL

RELATED APPLICATION

This application is a divisional of and claims priority to U.S. patent application Ser. No. 14/014,455, titled "PHOTORESIST REMOVAL" and filed on Aug. 30, 2013, which is incorporated herein by reference.

BACKGROUND

During fabrication of a semiconductor wafer, a photoresist is formed over the semiconductor wafer for photolithography processing. The photoresist comprises a light-sensitive material that reacts to light, such as a positive resist that becomes soluble when exposed to light or a negative resist that comes insoluble when exposed to light. During photolithography, light is used to transfer a pattern from a photomask to the photoresist on the semiconductor wafer. The pattern is either engraved or etched into the semiconductor wafer, or a material is deposited in the pattern and thus onto the semiconductor wafer. After the photolithography processing is complete, the photoresist is removed from the semiconductor wafer.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more systems and techniques for removing a photoresist from a semiconductor wafer are provided herein. A photoresist is used during lithography for patterning or depositing material onto a semiconductor wafer. Once the lithography process is complete, the photoresist is removed. The use of a strong photoresist stripping chemical or technique, such as a sulfuric acid hydrogen peroxide mixture (SPM) or other technique using relatively high temperatures such as over 80° C. results in pattern damage or thermal shock to the semiconductor wafer. Accordingly, as provided herein, the photoresist is removed using an activated trioxygen liquid at relatively lower temperatures such as about 80° C. or below. In an embodiment, the temperature corresponds to between about 25° C. to about 15° C. or below. The activated trioxygen liquid removes the photoresist while mitigating damage to the semiconductor wafer or structures formed therein.

Figure 1:
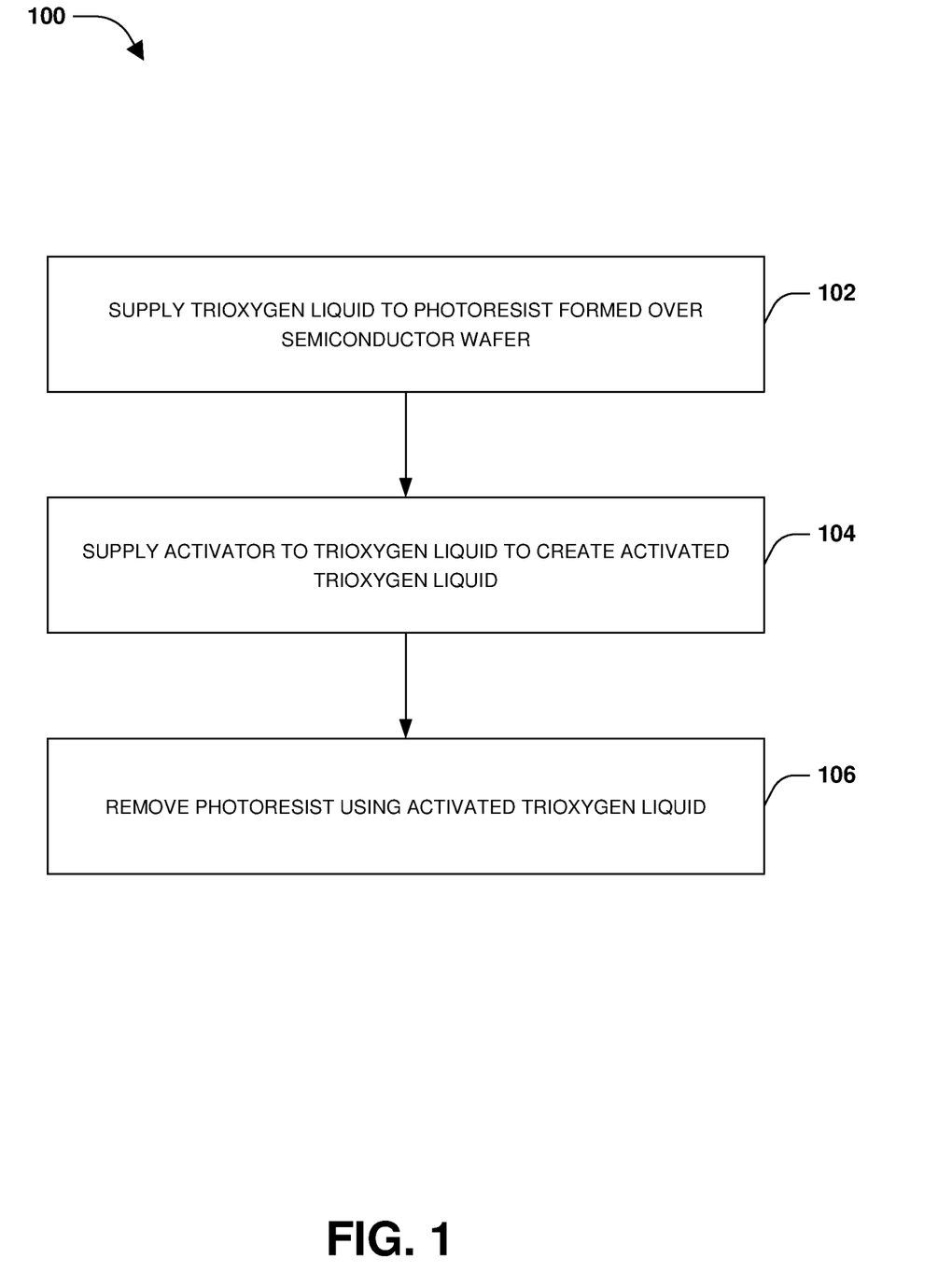
FIG. 1 is a flow diagram illustrating a method of removing a photoresist from a semiconductor wafer, according to some embodiments.

A method 100 of removing a photoresist from a semiconductor wafer is illustrated in FIG. 1. The photoresist is formed over the semiconductor wafer, such as for lithography, patterning, or material deposition processes. Once the photoresist is done being used, the photoresist is to be removed from the semiconductor wafer. Accordingly, trioxygen liquid is supplied to the photoresist, at 102. In an embodiment, the trioxygen liquid comprises between about 80 ppm to about 200 ppm of $O_3$. At 104, an activator is supplied to the trioxygen liquid to create activated trioxygen liquid. In an embodiment, the activator comprises an ultraviolet (UV) activator. In an embodiment, a UV lamp supplies the UV activator having a wavelength between about 150 nm to about 300 nm. The UV activator supplies energy to the trioxygen liquid to increase free radicals from the trioxygen liquid. The free radicals aid in removal of the photoresist. In an embodiment, the activator comprises a hydrogen peroxide ($H_2O_2$) activator. In an embodiment, the hydrogen peroxide activator is mixed with the trioxygen liquid at a mixing rate of about 1 ppm or between about 01. ml/min to about 0.5 ml/min. In an embodiment, deionized water is supplied to the semiconductor wafer, such as for cooling purposes to mitigate damage to the semiconductor wafer from thermal shock or to increase dissolution of the trioxygen liquid. The deionized water has a deionized water temperature less than or equal to a wafer temperature of the semiconductor wafer. In an embodiment, the deionized water temperature is about 15° C. or less, such that the wafer temperate is lowered to a temperature of about 80° C. or less such as between about 25° C. to about 25° C. or less. In an embodiment, lowering the wafer temperature, using the deionized water, increases trioxygen liquid dissolution. At 106, the photoresist is removed using the activated trioxygen liquid.

In an embodiment, an initial photoresist strip process is performed before the trioxygen liquid is supplied to the photoresist for removal of the photoresist such that the initial photoresist strip process removes a first portion of the photoresist and the activated trioxygen liquid removes a second portion, such as a remaining portion, of the photoresist. The initial photoresist strip process is performed to remove the first portion of the photoresist using a sulfuric acid hydrogen peroxide mixture (SPM) or other photoresist stripping process. In an embodiment, the initial photoresist strip process is performed to remove a photoresist crust formed over a top portion or side portions of the photoresist. The SPM, which is a relatively strong photoresist stripper, is used because the photoresist crust is relatively more difficult to remove than non-crust portions of the photoresist. In an embodiment, the initial photoresist strip process is performed after an implant process is performed. In an embodiment, merely the activated trioxygen liquid, but not the initial photoresist strip process, is used where a non-implant process is performed.

Figure 2:
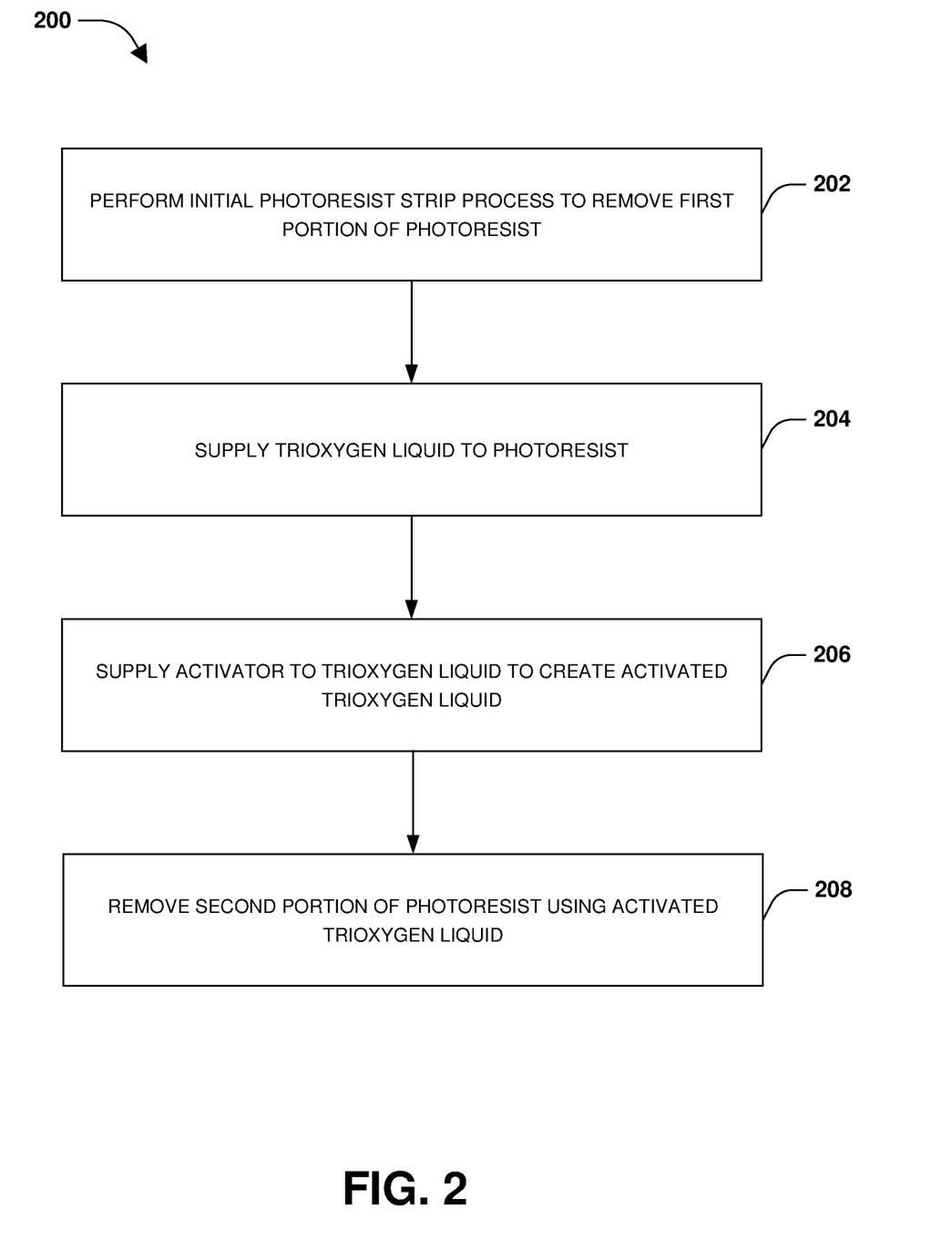
FIG. 2 is a flow diagram illustrating a method of removing a photoresist from a semiconductor wafer, according to some embodiments.

A method 200 of removing a photoresist from a semiconductor wafer is illustrated in FIG. 2. The photoresist is formed over the semiconductor wafer, such as for lithography, patterning, or material deposition processes. Once the photoresist is done being used, the photoresist is to be removed from the semiconductor wafer. In an embodiment, the photoresist comprises a first portion and a second portion. In an embodiment, the first portion overlays the second portion. In an embodiment, the first portion comprises a photoresist crust overlaying the second portion. At 202, an initial photoresist strip process is performed to remove the first portion of the photoresist. In an embodiment, the initial photoresist strip process uses SPM or other relatively strong photoresist stripper to remove the first portion because the first portion is relatively more difficult to remove than the second portion.

At 204, trioxygen liquid is supplied to the photoresist. In an embodiment, the trioxygen liquid is supplied after the initial photoresist strip process is complete, such that the first portion of the photoresist is removed and the second portion is exposed for removal using activated trioxygen liquid. At 206, an activator, such as an ultraviolet activator or a hydrogen peroxide activator, is supplied to the trioxygen liquid to create activated trioxygen liquid. In an embodiment, the activation of the trioxygen liquid increases free radicals from the trioxygen liquid. The free radicals aid in removal of the photoresist. The activated trioxygen liquid has a relatively higher dissolution in water under relatively lower temperatures, thus increasing photoresist stripping capabilities while mitigating damage to the semiconductor wafer otherwise caused by relatively higher temperatures. In an embodiment, deionized water is supplied to the semiconductor wafer. The deionized water has a deionized water temperature less than a wafer temperature of the semiconductor wafer. In an embodiment, the deionized water temperature is about 15° C. or less. The deionized water lowers the wafer temperature which mitigates thermal shock or other damage to the semiconductor wafer while enhancing stripping capabilities of the activated trioxygen liquid. At 208, the second portion of the photoresist is removed using the activated trioxygen liquid.

Figure 3:
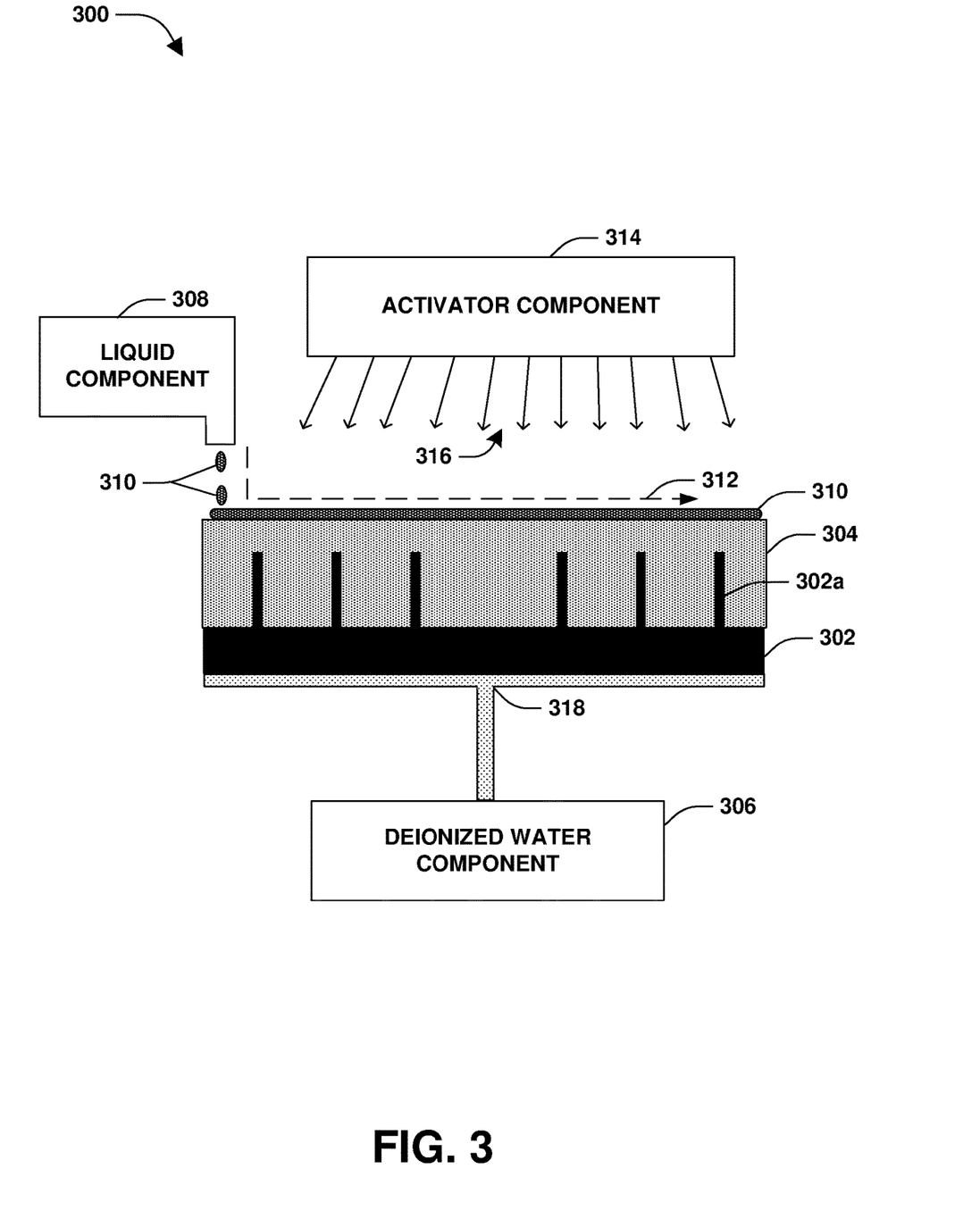
FIG. 3 is an illustration of a system for removing a photoresist from a semiconductor wafer using an ultraviolet activator to create activated trioxygen liquid, according to some embodiments.

FIG. 3 illustrates a system 300 for removing a photoresist 304 from a semiconductor wafer 302. The semiconductor wafer 302 comprises one or more structures, such as structure 302a, that are susceptible to damage during removal of the photoresist 304. Accordingly, the system 300 removes the photoresist 304 while mitigating damage to the semiconductor wafer 302. The system 300 comprise a liquid supplier 308. The liquid supplier 308 is configured to supply trioxygen liquid 310 to the photoresist 304. In can embodiment, the trioxygen liquid 310 is supplied in a direction 312 across a surface of the photoresist 304. In an embodiment, the trioxygen liquid 310 comprises between about 80 ppm to about 200 ppm of $O_3$.

Figure 5A:
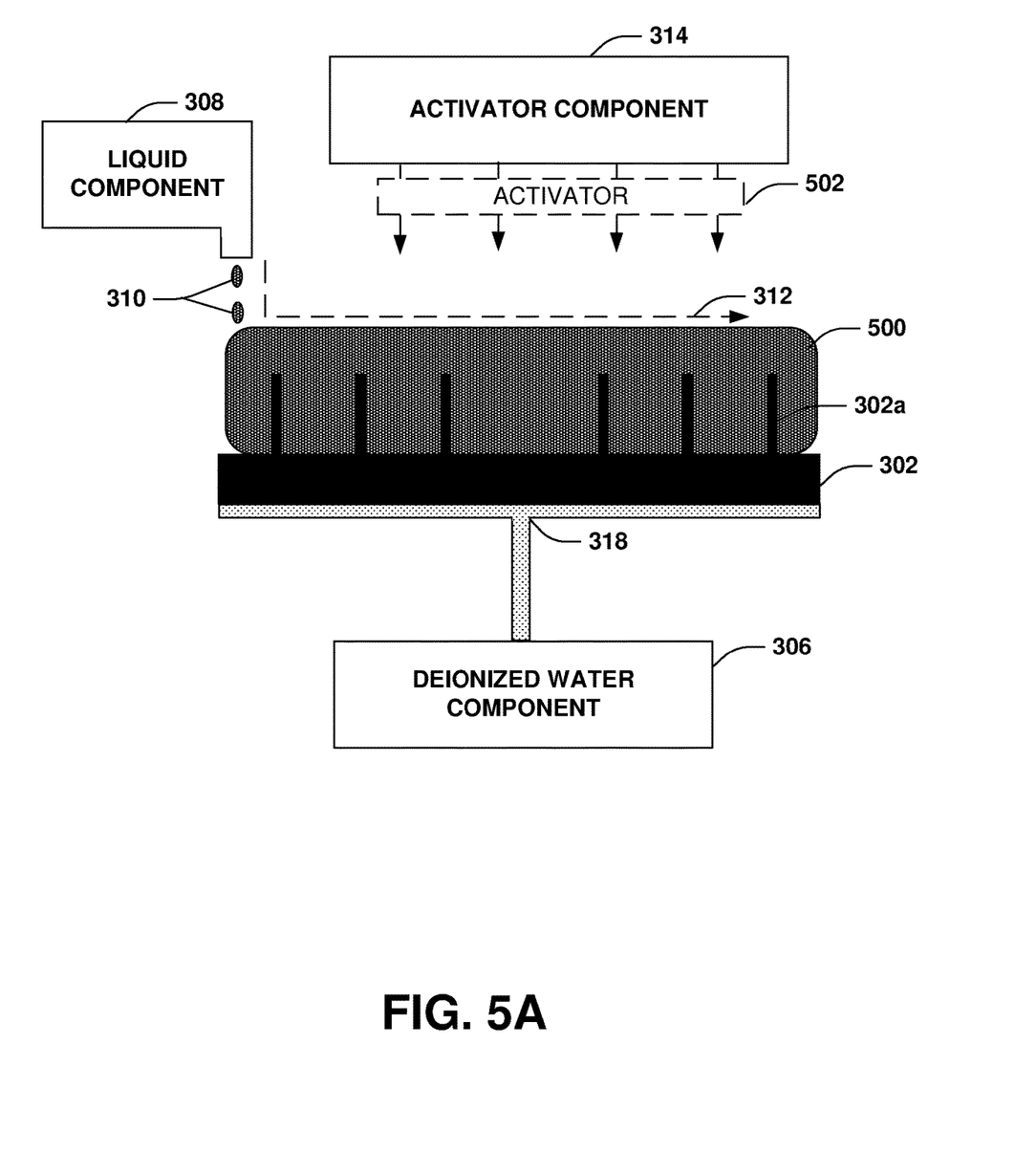
FIG. 5A is an illustration of a system for removing a photoresist from a semiconductor wafer, according to some embodiments.
Figure 5B:
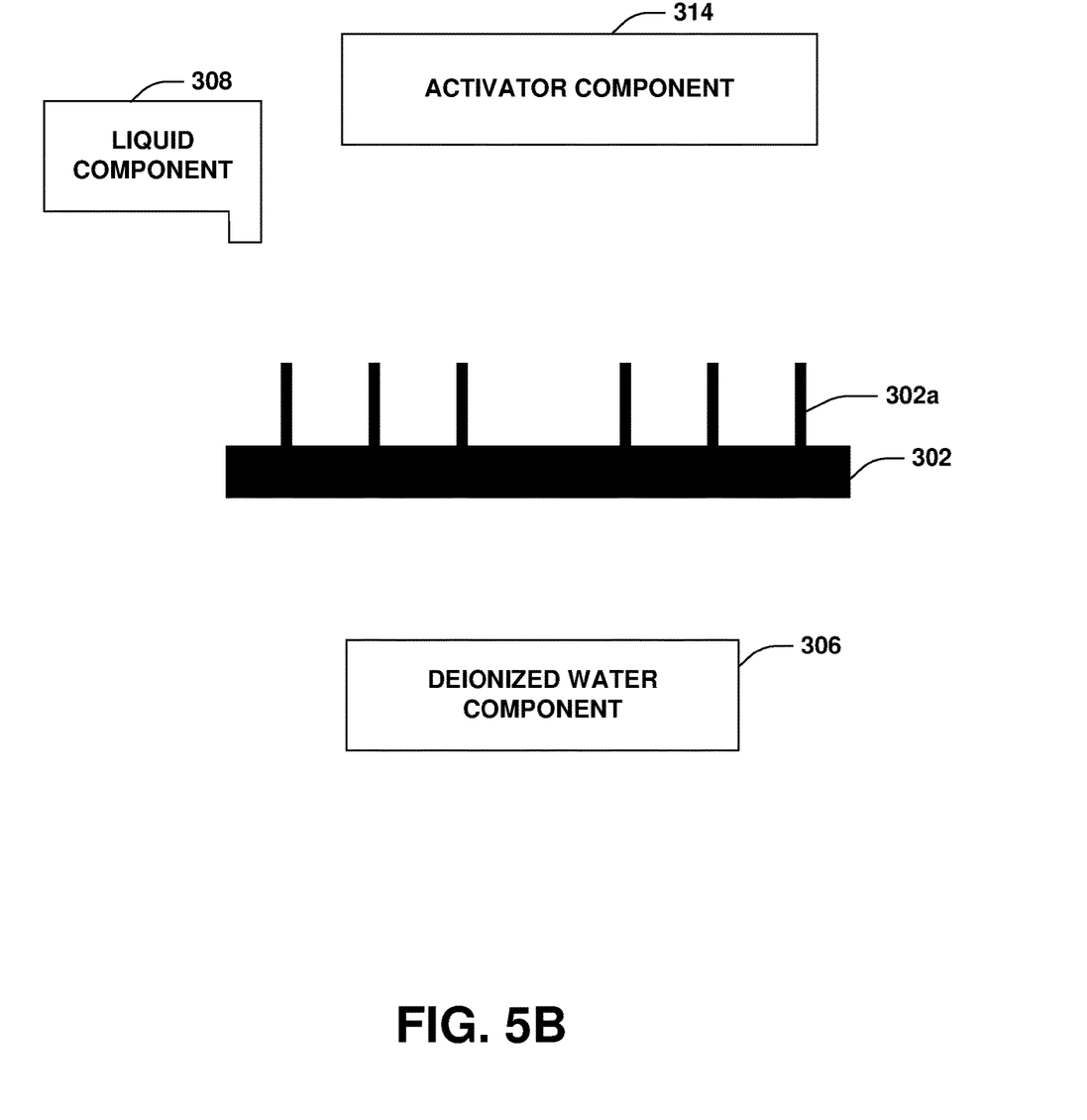
FIG. 5B is an illustration of a semiconductor wafer having a photoresist removed by activated trioxygen liquid, according to some embodiments.

The system 300 comprises an activator supplier 314. The activator supplier 314 is an ultraviolet light source configured to supply an activator, such as an ultraviolet activator 316, to the trioxygen liquid 310 to create activated trioxygen liquid for removal of the photoresist 304. In an embodiment, the ultraviolet activator 316 has a wavelength between about 150 nm to about 300 nm. The ultraviolet activator 316 is supplied to increase free radicals from the trioxygen liquid 310 for removal of the photoresist 304. An embodiment of removing the photoresist 304 using the activated trioxygen liquid is illustrated in FIGS. 5A and 5B. The system 300 comprises a deionized water component 306. The deionized water component 306 is configured to supply deionized water 318 to the semiconductor wafer 302. The deionized water 318 has a deionized water temperature that is less than a wafer temperature of the semiconductor wafer 302. In an embodiment, the deionized water temperature is about 15° C. or less. The deionized water 318 lowers the wafer temperature which mitigates thermal shock or other damage to the semiconductor wafer 302.

Figure 4:
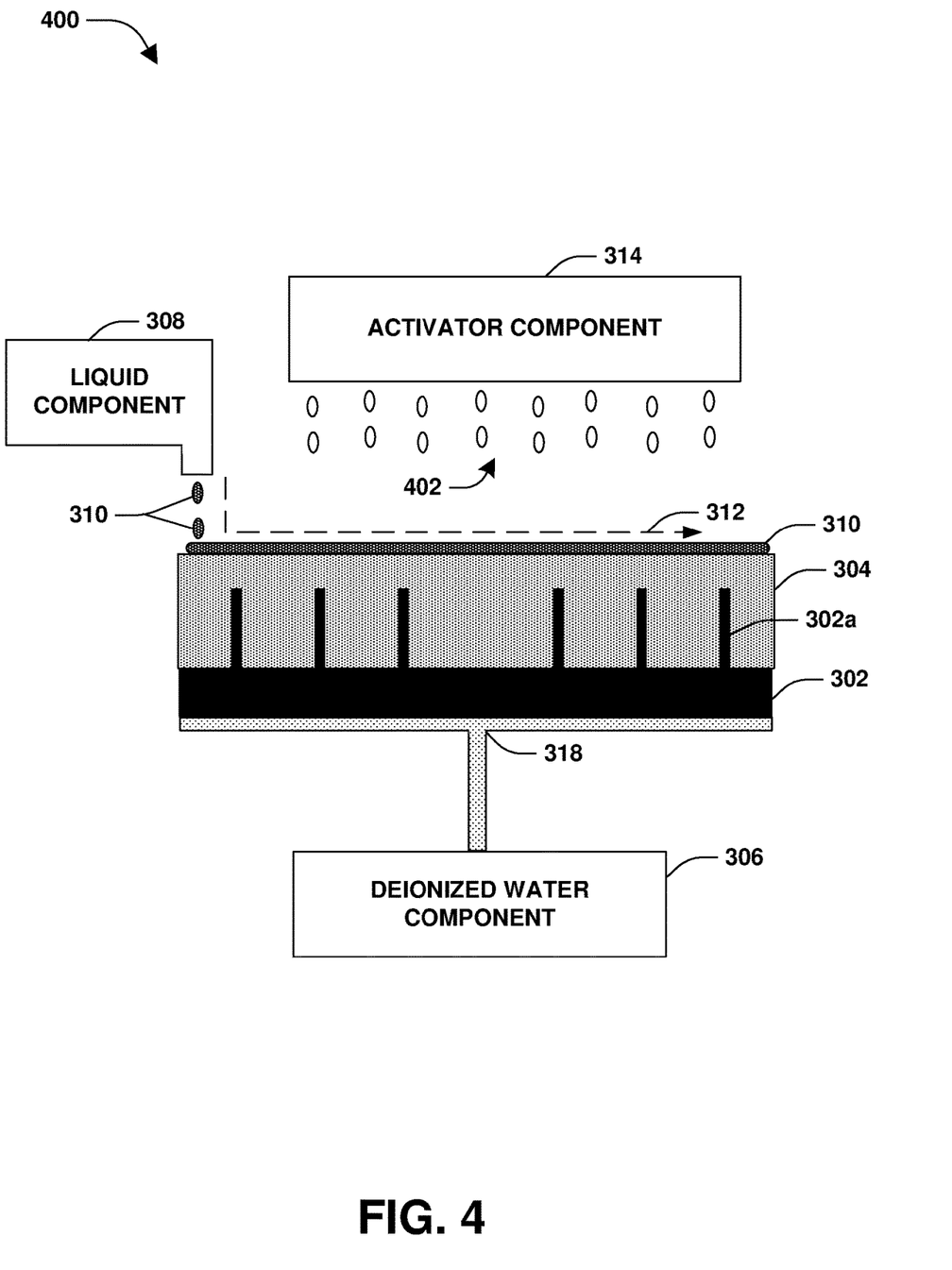
FIG. 4 is an illustration of a system for removing a photoresist from a semiconductor wafer using a hydrogen peroxide activator to create activated trioxygen liquid, according to some embodiments.

FIG. 4 illustrates a system 400 for removing a photoresist 304 from a semiconductor wafer 302. The system 400 comprises a liquid supplier 308 configured to supply trioxygen liquid 310 to the photoresist 304. The system 400 comprises an activator supplier 314. The activator supplier 314 is a liquid dispenser configured to supply an activator, such as a hydrogen peroxide activator 402, to the trioxygen liquid 310 to create activated trioxygen liquid for removal of the photoresist 304. In an embodiment, the hydrogen peroxide activator 402 is supplied at a mixing rate between about 0.1 ml/min to about 0.5 ml/min or about 1 ppm. In an embodiment, a chemical reaction is facilitated by the activation of the trioxygen liquid 310, such as $R-CH_3 + 3O_3 \rightarrow 3O_2 + CO_2 + H_2O$. An embodiment of removing the photoresist 304 using the activated trioxygen liquid is illustrated in FIGS. 5A and 5B. The system 400 comprises a deionized water component 306 configured to supply deionized water 318 to the semiconductor wafer 302.

FIG. 5A illustrates removal of a photoresist 304, formed over a semiconductor wafer 302, using activated trioxygen liquid 500. A liquid supplier 308 supplies trioxygen liquid 310 to the photoresist 304, which is activated by an activator 502, supplied by an activator supplier 314, to create the activated trioxygen liquid 500 (e.g., FIGS. 3 and 4). The activated trioxygen liquid 500 removes the photoresist 304. In an embodiment, free radicals, created by the activation of the trioxygen liquid 310, aids in removing the photoresist 304. While mitigating damage to the semiconductor wafer 302 such as a structure 302a, the photoresist 304 is removed from the semiconductor wafer 302 using the activated trioxygen liquid 500, as illustrated in FIG. 5B.

Figure 6A:
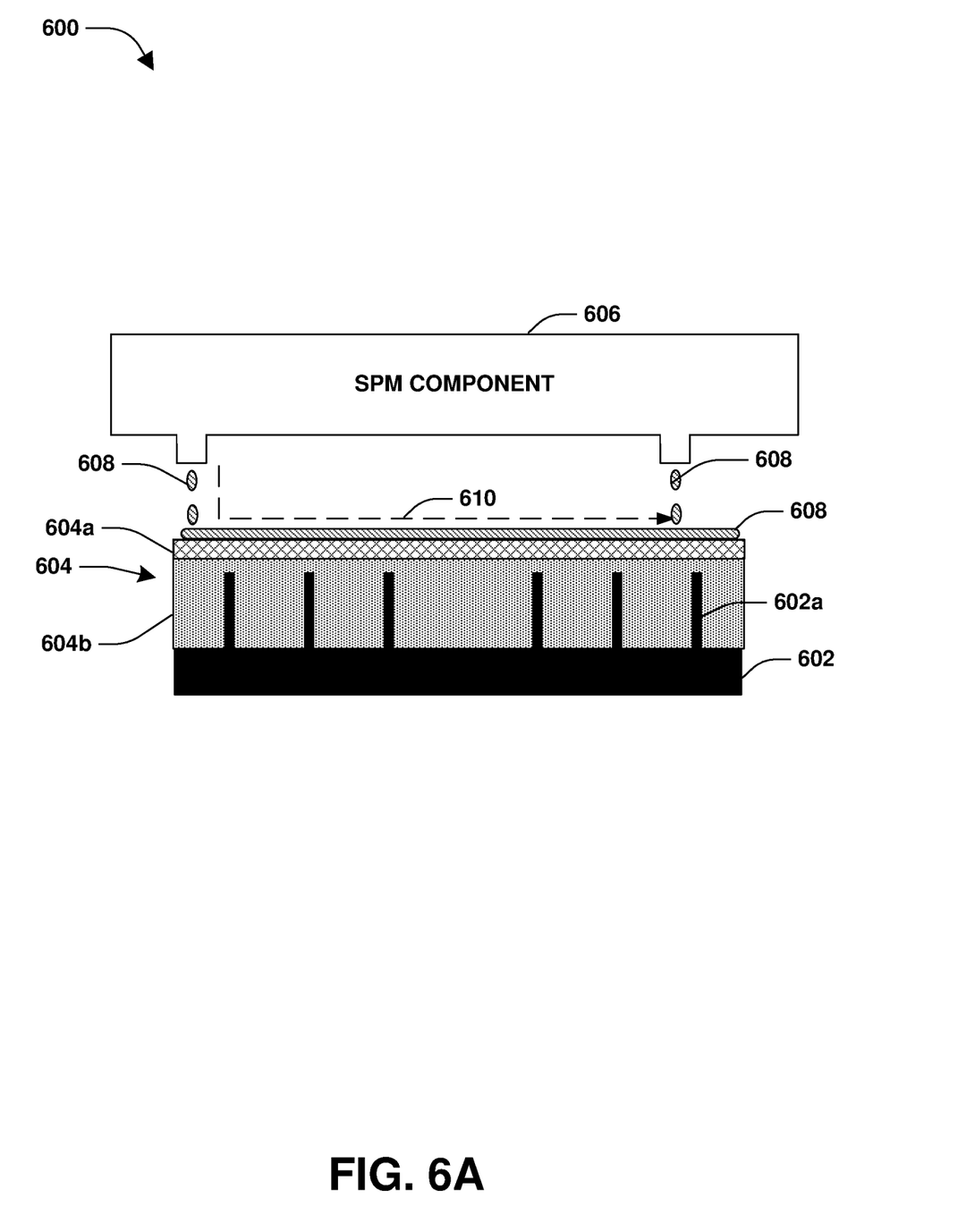
FIG. 6A is an illustration of a system for performing an initial photoresist strip process to remove a first portion of a photoresist, according to some embodiments.
Figure 6B:
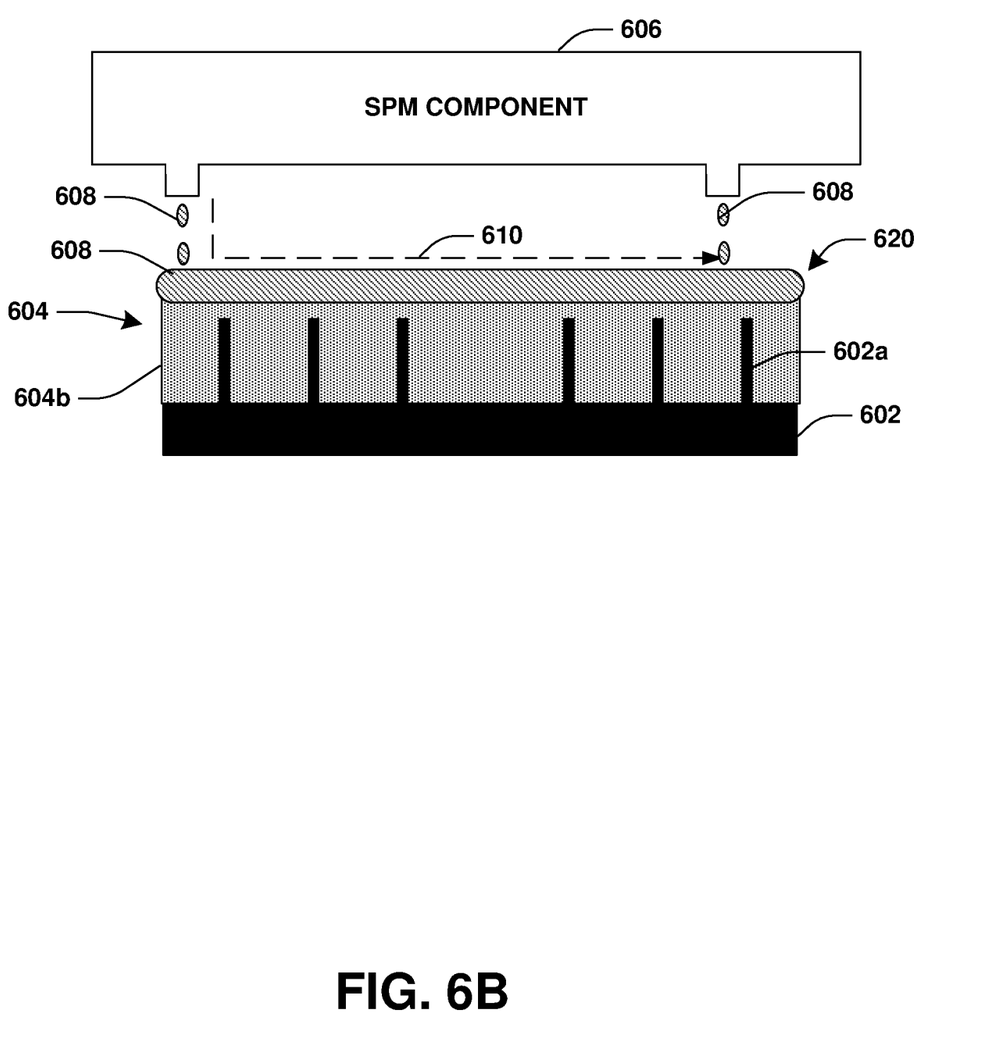
FIG. 6B is an illustration of a semiconductor wafer having a first portion of photoresist removed by an initial photoresist strip process, according to some embodiments.

FIG. 6A illustrates a system 600 for removing a photoresist 604 from a semiconductor wafer 602. In an embodiment, the semiconductor wafer 602 corresponds to 20 nm or less technology. The photoresist 604 comprises a first portion 604a, such as a photoresist crust, and a second portion 604b such as a secondary carbonized layer or other layer. The system 600 comprises an SPM component 606 configured to perform an initial photoresist strip process to remove the first portion 604a of the photoresist 604. In an embodiment, the SPM component 606 supplies a sulfuric acid hydrogen peroxide mixture (SPM) 608 to the first portion 604a in a direction 610 across a surface of the first portion 604a. In an embodiment, the SPM 608 is merely used to remove the first portion 604a, but not the second portion 604b, because the SPM 608 is a relatively strong photoresist stripper that otherwise damages the semiconductor wafer 602, such as causing poly line peeling or damage to a structure 602a. In this way, the SPM 608 removes 620 the first portion 604a, as illustrated in FIG. 6B.

Figure 6C:
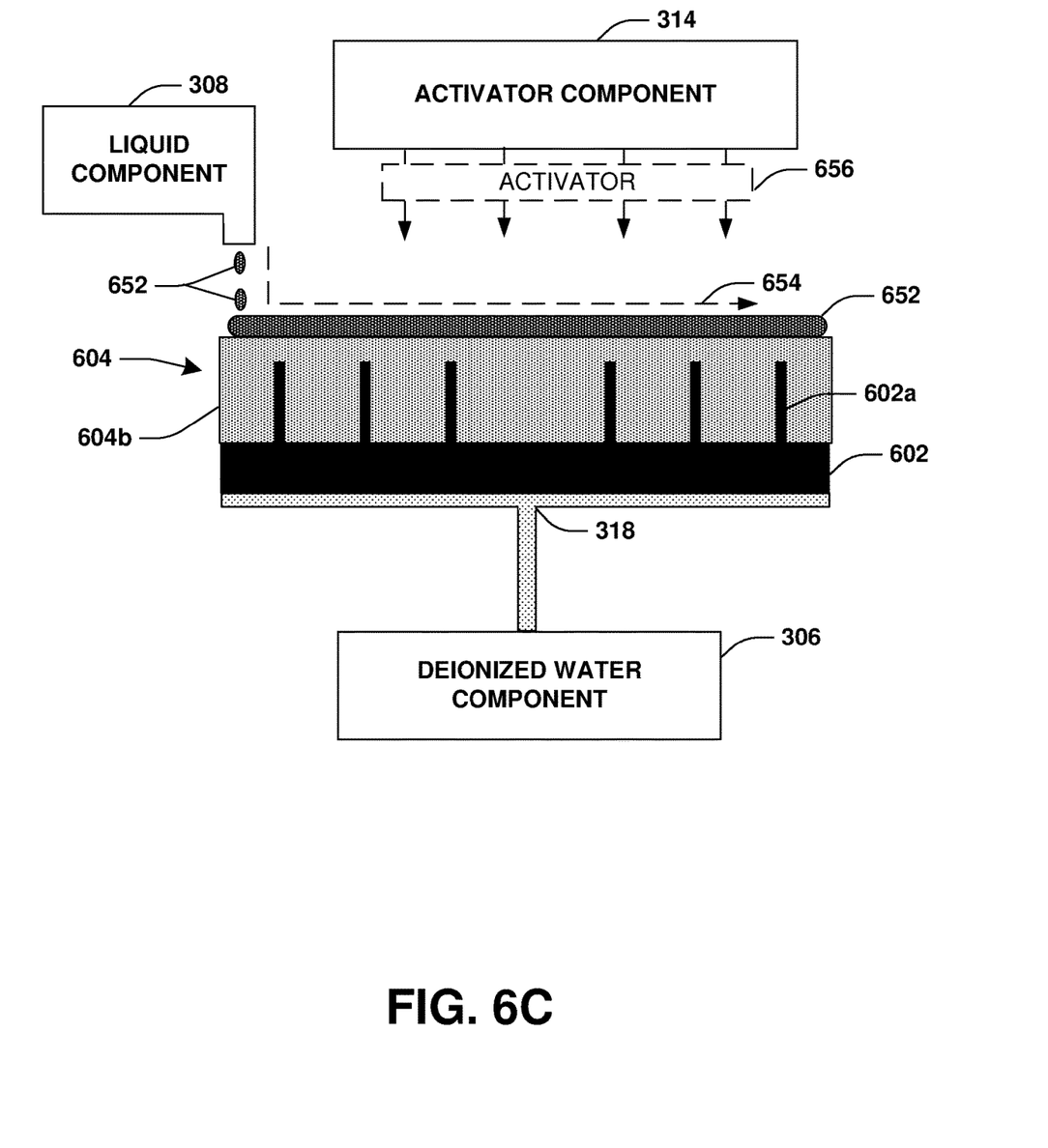
FIG. 6C is an illustration of a system for removing a second portion of a photoresist from a semiconductor wafer, according to some embodiments.
Figure 6D:
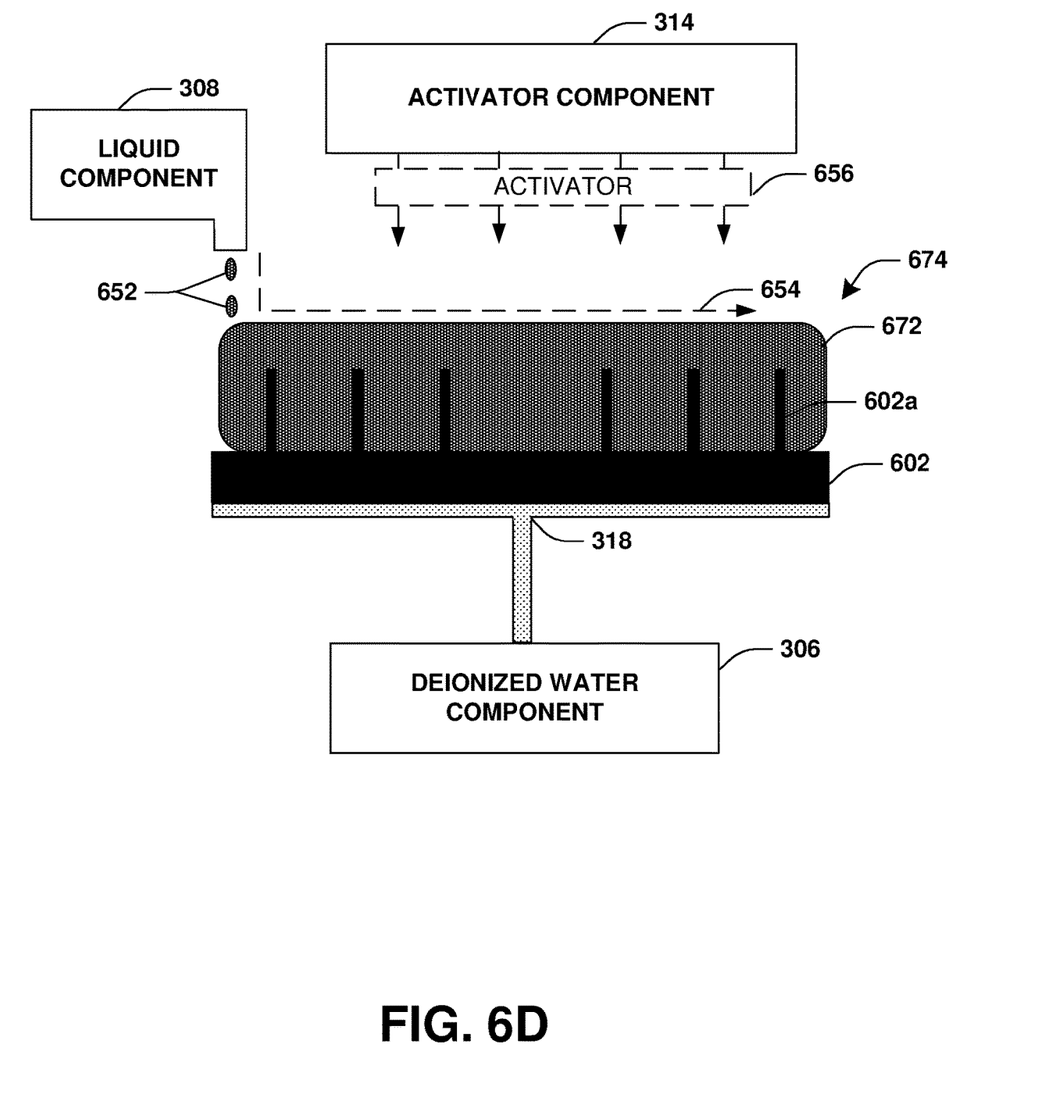
FIG. 6D is an illustration of removing a second portion of a photoresist using activated trioxygen liquid, according to some embodiments.
Figure 6E:
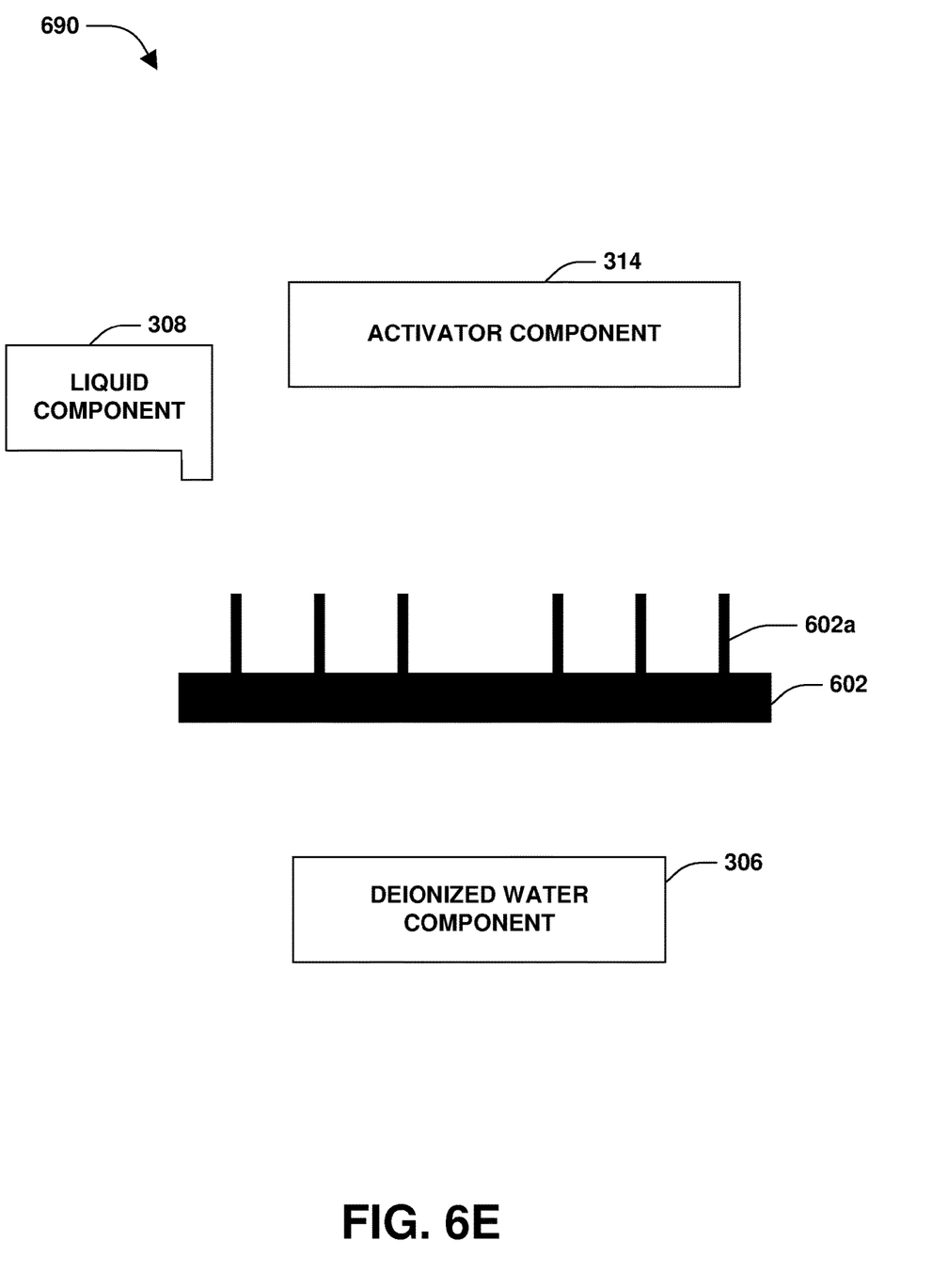
FIG. 6E is an illustration of a semiconductor wafer having a second portion of photoresist removed by activated trioxygen liquid, according to some embodiments.

The system 600 comprises at least one of a liquid supplier 308, an activator supplier 314, or a deionized water component 306, as illustrated in FIG. 6C. The liquid supplier 308 is configured to supply a trioxygen liquid 652 to the second portion 604b of the photoresist 604, such as in a direction 654 across a surface of the second portion 604b. In an embodiment, the liquid supplier 308 is configured to supply the trioxygen liquid 652 after the initial photoresist strip process is completed by the SPM component 606 (e.g., FIGS. 6A and 6B). The activator supplier 314 is configured to supply an activator 656 to the trioxygen liquid 652 to create an activated trioxygen liquid 672 for removal 674 of the second portion 604b of the photoresist 604, as illustrated in FIG. 6D. The deionized water component 306 is configured to supply deionized water 318 to the semiconductor wafer 602. The deionized water 318 has a deionized water temperature, such as 15° C. or less. The deionized water temperature is less than a wafer temperature of the semiconductor wafer 602, which mitigates damage to the semiconductor wafer 602 such as damage from thermal shock. In this way, the photoresist 604 is removed from the semiconductor wafer 602, while mitigating damage to the semiconductor wafer 602 due to the use of relatively lower temperatures during removal by the activated trioxygen liquid 672 or due to the use of SPM merely for removal of the first portion 604a of the photoresist 604, as illustrated in FIG. 6E.

According to an aspect of the instant disclosure, a system for removing a photoresist from a semiconductor wafer is provided. The system comprises a liquid supplier configured to supply trioxygen liquid to the photoresist. The system comprises an activator supplier configured to supply an activator to the trioxygen liquid to create activated trioxygen liquid for removal of the photoresist.

According to an aspect of the instant disclosure, a method for removing a photoresist from a semiconductor wafer is provided. The method comprises supplying trioxygen liquid to the photoresist. An activator is supplied to the trioxygen liquid to create activated trioxygen liquid. The activator comprises at least one of an ultraviolet (UV) activator or a hydrogen peroxide activator. The photoresist is removed using the activated trioxygen liquid.

According to an aspect of the instant disclosure, a method for removing a photoresist from a semiconductor wafer is provided. The method comprises performing an initial photoresist strip process to remove a first portion of the photoresist using a sulfuric acid hydrogen peroxide mixture (SPM). Trioxygen liquid is supplied to the photoresist. An activator is supplied to the trioxygen liquid to create activated trioxygen liquid. A second portion of the photoresist is removed using the activated trioxygen liquid.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A system for removing a photoresist from a semiconductor wafer, comprising:
   a sulfuric acid hydrogen peroxide mixture (SPM) supplier having a first nozzle and a second nozzle and configured to perform an initial photoresist strip process to remove a first portion of the photoresist using an SPM output through the first nozzle and the second nozzle, wherein the first nozzle and the second nozzle are arranged on the SPM supplier such that when the semiconductor wafer is positioned below the SPM supplier, the first nozzle and the second nozzle are positioned on radially opposite sides of the semiconductor wafer;
a liquid supplier have a third nozzle and configured to supply trioxygen liquid through the third nozzle to the photoresist over a first surface of the semiconductor wafer after the SPM supplier has performed the initial photoresist strip process;
an activator supplier configured to supply an activator to the trioxygen liquid to create activated trioxygen liquid; and
a deionized water supplier configured to supply deionized water to a second surface of the semiconductor wafer that is diametrically opposite the first surface while a second portion of the photoresist is removed using the activated trioxygen liquid, wherein the deionized water is supplied at a deionized water temperature that is less than a wafer temperature of the semiconductor wafer.

2. The system of claim 1, wherein:
the activator comprises hydrogen peroxide, and
the activator supplier comprises a liquid dispenser.

3. The system of claim 1, wherein:
the activator comprises an ultraviolet (UV) activator, and
the activator supplier comprises a UV light source.

4. The system of claim 1, wherein the liquid supplier is configured to coat the photoresist with the trioxygen liquid.

5. The system of claim 1, wherein:
the activator comprises hydrogen peroxide,
the activator supplier comprises a liquid dispenser, and
the activator supplier is configured to supply the hydrogen peroxide at a mixing rate between about 0.1 milliliter per minute and about 0.5 milliliter per minute.

6. The system of claim 1, wherein the trioxygen liquid comprises between about 80 parts-per-million (ppm) of $O_3$ and about 200 ppm of $O_3$.

7. The system of claim 1, wherein the SPM supplier is configured to perform the initial photoresist strip process merely when the semiconductor wafer and the photoresist are subjected to an implant process prior to the liquid supplier supplying the trioxygen liquid to the photoresist.

8. The system of claim 1, wherein the wafer temperature is about 80° C. and the deionized water temperature is about 15° C.

9. The system of claim 1, wherein the activator supplier is configured to supply the activator to the trioxygen liquid after the photoresist has been coated with the trioxygen liquid by the liquid supplier.

10. The system of claim 1, wherein the third nozzle is positioned such that the third nozzle overlies an edge region of the photoresist while the liquid supplier is supplying the trioxygen liquid to the photoresist.

11. The system of claim 10, wherein the activator supplier overlies a central region of the photoresist while the activator supplier is supplying the activator.

12. A system for removing a photoresist from a semiconductor wafer, comprising:
a liquid supplier configured to supply trioxygen liquid to the photoresist over a first surface of the semiconductor wafer to coat the photoresist with the trioxygen liquid, wherein a first nozzle of the liquid supplier through which the trioxygen liquid is dispensed is positioned such that the first nozzle overlies an edge region of the photoresist while the liquid supplier is supplying the trioxygen liquid to the photoresist;
a sulfuric acid hydrogen peroxide mixture (SPM) supplier configured to perform an initial photoresist strip process to remove a first portion of the photoresist using an SPM prior to the liquid supplier supplying the trioxygen liquid to the photoresist, wherein:
the SPM supplier comprises a second nozzle and a third nozzle through which the SPM is dispensed, and
the second nozzle and the third nozzle are arranged on the SPM supplier such that the second nozzle and the third nozzle are positioned on radially opposite sides relative to a midpoint of the SPM supplier;
an activator supplier configured to supply an activator to the trioxygen liquid separately from the SPM supplier supplying the SPM and after the photoresist has been coated with the trioxygen liquid to create activated trioxygen liquid on the photoresist; and
a deionized water supplier configured to supply deionized water to a second surface of the semiconductor wafer that is diametrically opposite the first surface while the photoresist is removed using the activated trioxygen liquid.

13. The system of claim 12, wherein:
the activator comprises hydrogen peroxide, and
the activator supplier comprises a liquid dispenser.

14. The system of claim 12, wherein:
the activator comprises an ultraviolet (UV) activator, and
the activator supplier comprises a UV light source.

15. The system of claim 12, wherein the deionized water supplier is configured to supply the deionized water to the second surface at a deionized water temperature that is less than a wafer temperature of the semiconductor wafer.

16. The system of claim 12, wherein the SPM supplier is configured to perform the initial photoresist strip process merely when the semiconductor wafer and the photoresist are subjected to an implant process prior to the liquid supplier supplying the trioxygen liquid to the photoresist.

17. The system of claim 12, wherein the trioxygen liquid comprises between about 80 parts-per-million (ppm) of $O_3$ and about 200 ppm of $O_3$.

18. A system for removing a photoresist from a semiconductor wafer, comprising:
a sulfuric acid hydrogen peroxide mixture (SPM) supplier configured to perform an initial photoresist strip process to remove a first portion of the photoresist using an SPM, wherein:
the SPM supplier comprises a first nozzle and a second nozzle through which the SPM is dispensed, and
the first nozzle and the second nozzle are arranged on the SPM supplier such that the first nozzle and the second nozzle are positioned on radially opposite sides relative to a midpoint of the SPM supplier;
an activator supplier configured to activate trioxygen liquid disposed on the photoresist over a first surface of the semiconductor wafer to create activated trioxygen liquid on the photoresist after the SPM supplier has performed the initial photoresist strip process; and
a deionized water supplier configured to supply deionized water to a second surface of the semiconductor wafer that is diametrically opposite the first surface while a second portion of the photoresist is removed using the activated trioxygen liquid to control a wafer temperature of the semiconductor wafer.

19. The system of claim 18, wherein:
the activator supplier is configured to supply an activator comprising at least one of hydrogen peroxide or an ultraviolet (UV) activator to the trioxygen liquid to activate the trioxygen liquid,
when the activator comprises the hydrogen peroxide, the activator supplier comprises a liquid dispenser, and when the activator comprises the UV activator, the activator supplier comprises a UV light source.

20. The system of claim 18, wherein a deionized water temperature of the deionized water is less than or equal to 15° C.

* * * * *